United States Patent
Takahashi

(10) Patent No.: US 7,230,327 B2
(45) Date of Patent: Jun. 12, 2007

(54) IC CARD

(75) Inventor: Norio Takahashi, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 2 days.

(21) Appl. No.: 11/201,380

(22) Filed: Aug. 11, 2005

(65) Prior Publication Data

US 2006/0113651 A1   Jun. 1, 2006

(30) Foreign Application Priority Data

Dec. 1, 2004  (JP)  ............................. 2004-348970

(51) Int. Cl.
*H01L 23/02*  (2006.01)
*H05K 1/14*   (2006.01)

(52) U.S. Cl. .................. 257/679; 257/678; 361/730; 361/737; 361/742

(58) Field of Classification Search ................. 257/679; 361/737, 730, 742, 770
See application file for complete search history.

(56) References Cited

U.S. PATENT DOCUMENTS 6,304,454 B1 * 10/2001 Akamatsu et al. .......... 361/752

6,988,668 B2 * 1/2006 Osako et al. ............... 235/492
2006/0220202 A1 * 10/2006 Osako et al. ............... 257/679

FOREIGN PATENT DOCUMENTS

| JP | 2001-160125 | 6/2001 |
|----|-------------|--------|
| JP | 2001-175835 | 6/2001 |
| JP | 2003-050980 | 2/2003 |

* cited by examiner

*Primary Examiner*—Long K. Tran
(74) *Attorney, Agent, or Firm*—Rabin & Berdo, PC

(57) ABSTRACT

An IC card that has improved endurance and demonstrates increased resistance to cracking of the case and peeling of the substrate when a bending force acts upon the IC card. First protrusions and second protrusions are formed in a recess for fitting a LGA. The second protrusions are connected to the side wall of the recess on the card center side. Because the first protrusions maintaining a constant and correct gap between the bottom portion and LGA, that is, a constant and correct thickness of an adhesive, and the second protrusions are provided, the LGA and case can be reliably bonded together. The boundary portion with the thick portion of the recess on the card center side is a portion where stresses are easily concentrated and cracks can easily occur. However, because the second protrusions provided in the bottom portion of the recess are integrally connected to the side wall, the boundary portion is reinforced and stress concentration is relaxed. As a result, the occurrence of cracking from the boundary portion can be inhibited.

8 Claims, 5 Drawing Sheets

FIG. 4A
Prior Art
FIG. 4B
Prior Art
FIG. 4C
Prior Art
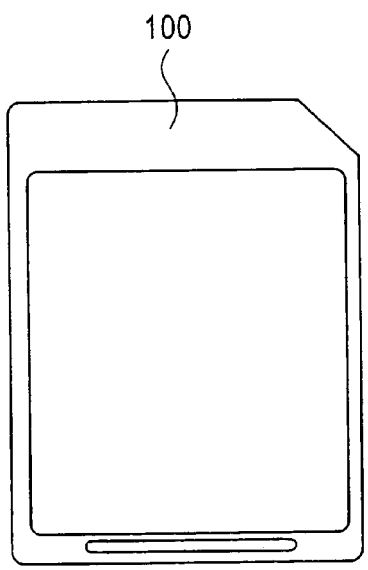
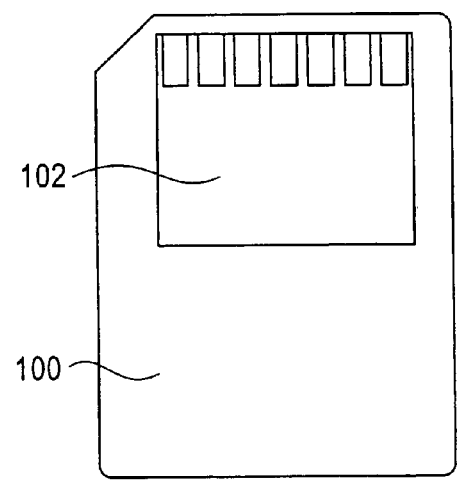

IC CARD

BACKGROUND OF THE INVENTION

1. Field of the Invention

The present invention relates to an IC card, and more particularly to an IC card with improved endurance against bending.

2. Description of the Related Art

Memory cards have been spreading rapidly as an external memory medium suitable for personal computers, multi-functional terminals, digital cameras, cellular phones, and portable audio players.

Multimedia cards standardized by MMCA (Multimedia Card Association), which is a standardization body, are widely known.

In those multimedia cards, as shown in FIG. 3 and FIG. 4, a substrate 102 carrying a memory is attached with an adhesive or the like to a card 100 made from a synthetic resin and having a size of a large postage stamp.

The structure of multimedia cards is disclosed, for example, in Japanese Patent Applications Laid-open No. 2003-50980, 2001-175835, and 2001-160125.

Japanese Patent Application Laid-open No. 2003-50980 describes that only the peripheral portion of the substrate is attached to the case with an adhesive or the like, and the problem associated with such a structure is that the bonding surface area of the peripheral portion of the substrate alone is small and when the case is bent, the substrate can easily peel off. Japanese Patent Application Laid-open No. 2001-160125 describes a similar structure, but no description relating to the substrate bonding method is provided.

Japanese Patent Application Laid-open No. 2001-175835 describes a structure in which a substrate is fitted into a recess in a case and joined thereto with an adhesive or the like. However, with such a configuration it is necessary, for example, to apply the adhesive by dropping into the recess and then to apply a pressure with a certain force from above to the substrate when the substrate is fitted into the recess.

The problem is, however, that with certain pressure application positions the substrate is tilted, a thin portion and a thick portion appear in the adhesive layer, and the bonding strength differs depending on location and is insufficient in the portion with a thin adhesive layer.

Furthermore, even if the pressure is uniformly applied to the substrate, if the applied pressure is too low, the substrate protrudes from the case surface and the thickness becomes outside of the range stipulated by the standard relating to IC cards. Conversely, if the applied force is too high, the adhesive escapes from the gap, the entire adhesive layer becomes thin, and the adhesive strength is sometimes insufficient.

Thus, within the framework of the conventional technology, various problems were associated with bonding a substrate by using an adhesive.

Further, the following problems were also associated with the conventional structure of IC cards.

Thus, when such a small IC card is inserted into a card slot, in most cases the user inserts the card by holding it between the fingers in the vicinity of the card center. In such cases, bending stresses act upon the IC card.

Japanese Patent Application Laid-open No. 2003-50980 describes the possibility of greatly reducing the production cost by making the substrate about half the size of the case.

However, if the substrate is about half the size of the case, the boundary of a thin portion where the substrate is disposed and a thick portion where the substrate is not disposed in the case is located in the vicinity of the case center in the insertion direction (see FIG. 3 of the aforementioned patent application). The problem is that if a flat case 100 such as shown in FIG. 5A is subjected to bending deformation as shown in FIG. 5B, then when the adhesive strength is insufficient, a substrate 102 peels off from a recess 104 into which the substrate 102 was fitted or, as shown in FIG. 5C, stresses concentrate in the vicinity of the end portion (close to the corner of the bottom portion of the recess 104), in the card center side, of the recess 104 into which the substrate 102 was fitted and a crack 106 appears therein.

SUMMARY OF THE INVENTION

With the foregoing in view, it is an object of the present invention to provide an IC card that has improved endurance and demonstrates increased resistance to cracking of the case and peeling of the substrate when a bending force acts upon the IC card.

The invention of claim 1 provides an IC card in which a substrate with a semiconductor chip mounted thereon is fitted and fixed with an adhesive in a recess provided in a side surface of a case in the form of a card and in which the direction of insertion into a card slot is specified, wherein at least one or more protrusions that abut against the rear surface of the substrate and form a gap for holding the adhesive between the substrate and the bottom portion are formed in the bottom portion of the recess, and at least one of the protrusions is linked to the side wall of the recess extending in the direction crossing the insertion direction and in the closest proximity to the central portion of the recess in the insertion direction of the case.

The operation of the IC card described in claim 1 will be explained below.

When the substrate is bonded to the case with an adhesive, for example, the adhesive is applied by dropping into the recess and then the substrate is fitted into the recess and the substrate is pressed against the bottom portion of the recess. When the pressure is applied to the substrate, the rear surface of the substrate is bought into contact with the protrusions and an adhesive layer with a thickness equivalent to the height of the protrusions is ensured between the recess and the substrate, thereby enabling reliable bonding of the substrate and the case.

When the card is inserted into the card slot, the user holds the card between the fingers in the vicinity of the card center. Therefore, a force in the direction bent with respect to the insertion direction sometimes acts upon the card. The bending force becomes especially high when the card is tilted against the card slot.

However, because, as described hereinabove, a certain thickness of the adhesive layer is ensured and the substrate and case are reliably bonded together in this IC card, the substrate can be prevented from peeling off when the bending force acts upon the card.

Further, the case is formed to have a thin portion where the recess is formed and a thick portion where no recess is formed, but if a bending force acts upon the case, stresses are concentrated causing cracking in the zones with a large difference in thickness, that is, in the end portion of the recess that is the closest to the center of the card in the insertion direction.

However, in the above-described IC card, the protrusion linked to the side wall of the recess serve as a reinforcement and the concentration of stresses is also relaxed. Therefore, the appearance of cracks can be inhibited.

The invention described in claim 2 provides the IC card of claim 1, wherein the protrusion linked to the side wall of the recess is formed to become narrower with the distance from the side wall of the recess.

The operation of the IC card described in claim 2 will be explained below.

For the protrusion linked to the side wall of the recess to demonstrate an increased reinforcement effect, it is preferred that the portion connected to the side wall of the recess has a large width. However, if the width of the protrusion is too large, the bonding surface area decreases. For this reason, taking into account the balance of the reinforcement effect and the bonding surface area, it is preferred that the protrusion connected to the side wall of the recess be so formed that the width thereof will decrease with the distance from the side wall of the recess.

The invention described in claim 3 provides the IC card of claim 1 or claim 2, wherein the height of the protrusion is set within a range of 0.2–0.3 mm.

The operation of the IC card described in claim 3 will be explained below.

When the height of the protrusion is set within a range of 0.2–0.3 mm, the thickness of the adhesive layer becomes within a range of 0.2–0.3 mm and a sufficient bonding strength of the adhesive can be ensured.

The invention described in claim 4 provides an IC card of any of claims 1 to 3, wherein the side wall of the recess is disposed within a range of ½ L to ⅓ L from the distal edge of the card in the insertion direction, where L stands for the length of the card in the insertion direction.

The operation of the IC card described in claim 4 will be explained below.

When the side wall of the recess is disposed within a range of ½ L to ⅓ L from the distal edge of the card in the insertion direction, stresses are especially easily concentrated and cracks easily occur in the case. Therefore, when the side wall of the recess is disposed within a range of ½ L to ⅓ L from the distal edge of the card in the insertion direction, the reinforcement effect of the protrusions linked to the side wall of the recess is especially strong.

As explained hereinabove, because the IC card described in claim 1 has the above-described configuration, the resultant excellent effect is that cracking of the case and peeling of the substrate under the applied bending force can be prevented and endurance can be improved.

Because the IC card described in claim 2 has the above-described configuration, the resultant excellent effect is that adhesive strength can be ensured, while increasing the reinforcement effect of protrusions.

Because the IC card described in claim 3 has the above-described configuration, the resultant excellent effect is that a sufficient adhesive strength can be ensured.

Because the IC card described in claim 4 has the above-described configuration, the resultant excellent effect is that the reinforcement effect of protrusions is especially strong.

BRIEF DESCRIPTION OF THE DRAWINGS

FIG. 4A is a rear view of another conventional IC card, FIG. 4B is a side view of the IC card, and FIG. 4C is a plan view of the IC card.

DETAILED DESCRIPTION OF THE INVENTION

An embodiment of the present invention will be described below in greater detail with reference to the appended drawings.

Figure 1A:
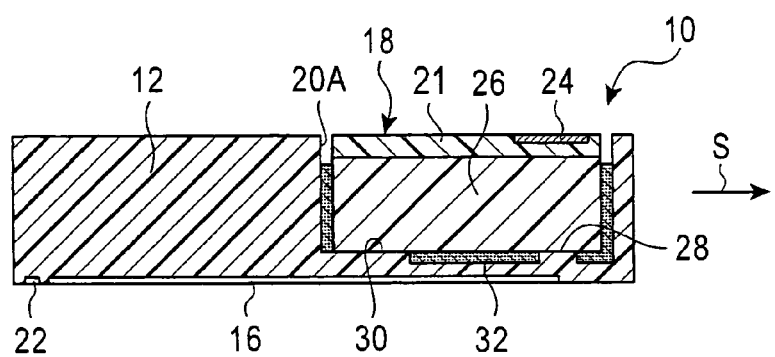
FIG. 1A is a longitudinal sectional view along the insertion direction of the IC card of an embodiment of the present invention.
Figure 1B:
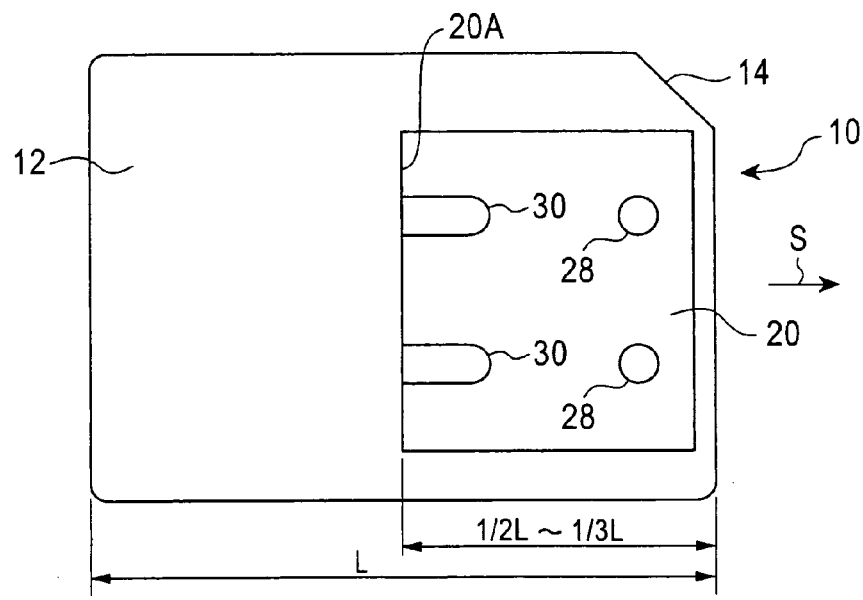
FIG. 1B is a plan view of the case of the IC card.
Figure 1C:
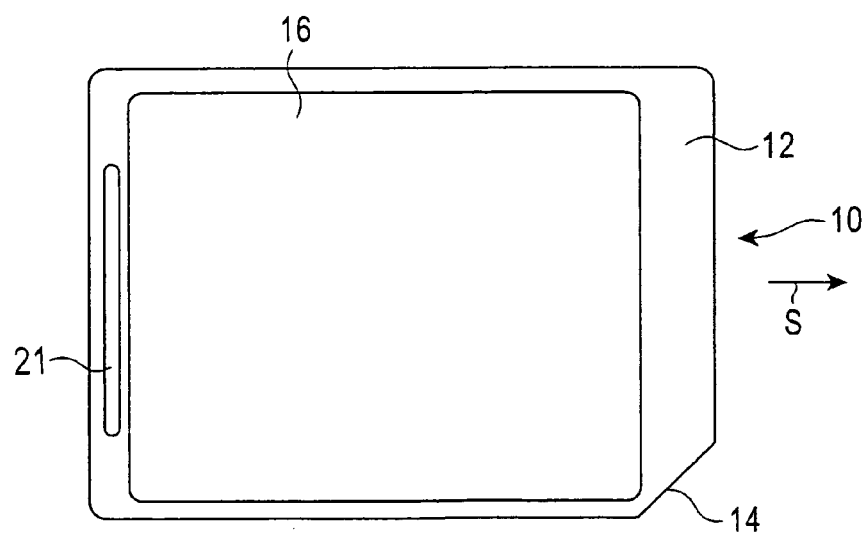
FIG. 1C is a rear view of the case of the IC card.

As shown in FIG. 1, in the present embodiment, an IC card 10 is a multimedia card.

The IC card 10 has a rectangular card shape with a length of 24.0 mm, a width of 32.0 mm, and a thickness of 1.4 mm.

FIG. 1A is a cross-sectional view of the IC card 10; in the figure, the thickness of the card is increased to facilitate understanding of the structure.

The IC card 10 comprises a case 12 made from a synthetic resin.

The IC card 10 is designed to be inserted in the direction of arrow S into a card slot (not shown in the figure) of a device.

In the case 12, a notch 14 indicating the insertion direction is formed in the corner on one short side (right side in the figure).

A label attachment area 16 in the form of a shallow recess for attaching a label where the product name and storage capacity are indicated is formed in the surface of the case 12.

Further, a rectangular cavity 21 for card removal is formed in the vicinity of other short side of the case 12.

On the other hand, a recess 20 for fitting a LGA 18 of a saw-cut type that has a length of about half that of the case 12 in the insertion direction is formed in the rear surface of the case 12 from the one short side (side in the card insertion direction) of the case 12 toward the central portion in the card insertion direction.

The LGA 18 comprises a substrate 22. A flash memory, which is a nonvolatile semiconductor memory, and a controller (not shown in the figure) for controlling the flash memory are mounted on the mounting surface of the substrate 22, and they are connected to electrodes 24 disposed on the rear surface of the substrate 22.

A total of 7 electrodes 24 are provided correspondingly to the card slot of the device (only one electrode is shown in FIG. 1A). Data exchange between the IC card 10 and the device is conducted by electrically connecting those electrodes 24 and the terminals of the card slot.

The aforementioned flash memory and controller are sealed with a molding resin 26.

The LGA 18 of the present embodiment has a rectangular shape and is formed to have a constant thickness.

The recess 20 is formed to have a constant depth and a rectangular shape such as to fit the LGA 18.

In the bottom portion of the recess 20, a pair of first protrusions 28 are formed on the insertion side and a pair of second protrusions 30 are formed on the card center side.

All the first protrusions 28 and second protrusions 30 are formed to have the same height, and if the LGA 18 is disposed inside the recess 20 so that the LGA 18 is brought into contact with the first protrusions 28 and second protrusions 30, the rear surface (front surface of the substrate 22)

of the LGA 18 is coplanar with the case surface, and a gap of a constant size (height of the protrusions) is formed between the bottom portion of the recess 20 and the front surface of a mold resin 26 of the LGA 18.

In the present embodiment, the case 12 and LGA 18 are bonded together with an adhesive 32 introduced into the gap between the recess 20 and LGA 18.

Here, the first protrusions 28 are disposed in a position separated from the side wall of the recess 20.

On the other hand, the second protrusions 30 are connected to the side wall 20A (thick portion of the case 12) of the recess portion 20 on the central side thereof in the card insertion direction and have an almost rectangular shape extending in the insertion direction of the IC card 10.

Further, in the present embodiment, because the thickness of the case 12 is determined by a standard (1.4 mm), if the depth of the label attachment area 16 is required to be about 0.1 mm, the size obtained by adding up the thickness of the LGA 18, the case thickness in the portion of recess 20, and the height of the protrusions, that is, the thickness of the adhesive 32, has to be 1.3 mm, and if the balance of the entire body ensuring an adhesive strength between the LGA 18 and case 12 is considered, it is preferred that the thickness of the adhesive 32 (height of the protrusions) be within a range of 0.2–0.3 mm, the thickness of the LGA 18 be within a range 0.9–1.0 mm, and the case thickness in the portion of the recess 20 be within a range 0.1–0.2 mm.

If a thinner LGA 18 can be formed, the case thickness in the portion of the recess 20 can be increased.

With the IC card 10 of the present embodiment, the first protrusions 28 and the second protrusions 30 are formed in the bottom portion of the recess 20 so as to provide for a constant and correct gap between the bottom portion and the LGA 18, that is, for a constant and correct thickness of the adhesive 32. Therefore, the LGA 18 and case 12 can be reliably bonded together.

Further, the side wall 20A of the recess 20 on the card center side is positioned almost in the center in the longitudinal direction of the card, and when a force acts that tries to bend the IC card 10 in the longitudinal direction, the boundary portion of the thin section (recess 20) and thick portion of the case 12 becomes a portion where stresses are easily concentrated and cracks can easily occur. However, because the second protrusions 30 provided in the bottom portion of the recess 20 are integrally connected to the side wall 20A, the boundary portion is reinforced and stress concentration is relaxed. As a result, the occurrence of cracking from the boundary portion can be inhibited.

Further, stresses are especially easily concentrated and the reinforcing effect of the second protrusions 30 linked to the side wall 20a is especially high when the side wall 20A of the recess 20 on the side of the card center is disposed within a range of ½ L to ⅓ L from the distal edge of the card in the insertion direction.

Here, the first protrusions 28 serve to maintain the distance between the LGA 18 and the bottom portion of the recess 20 and are not considered to produce a reinforcing effect in the vicinity of the side wall 20A, as the second protrusions 30. Therefore, it is preferred that the surface area thereof be reduced to ensure the bonding surface area.

Figure 2:
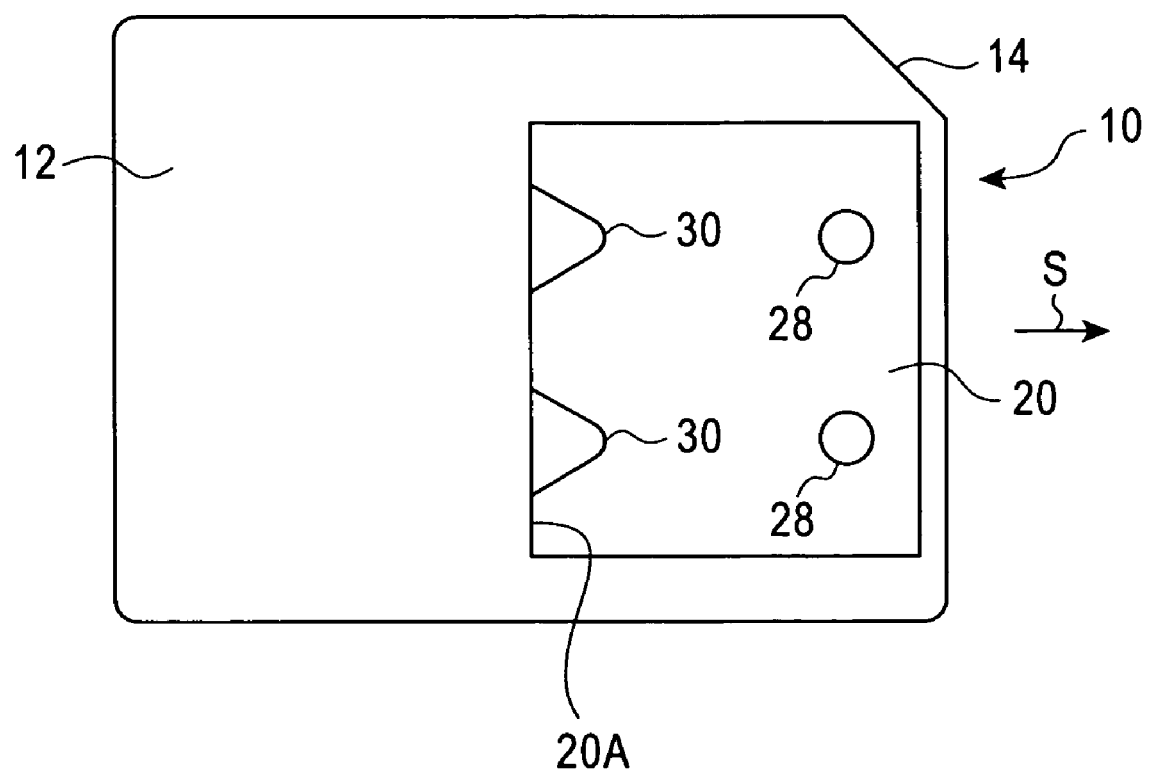
FIG. 2 is a plan view of the case of the IC card of another embodiment of the present invention.
Figure 3A:
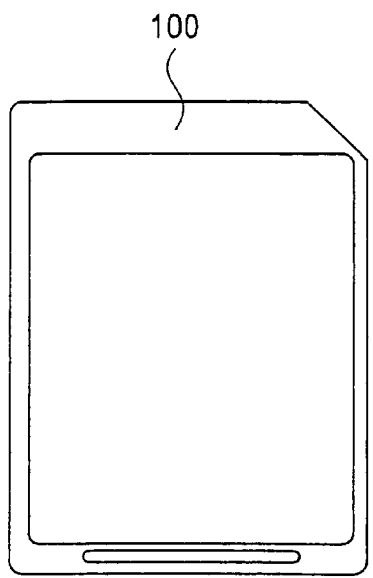
FIG. 3A is a rear view of the conventional IC card.
Figure 3B:
FIG. 3B is a side view of the IC card.
Figure 3C:
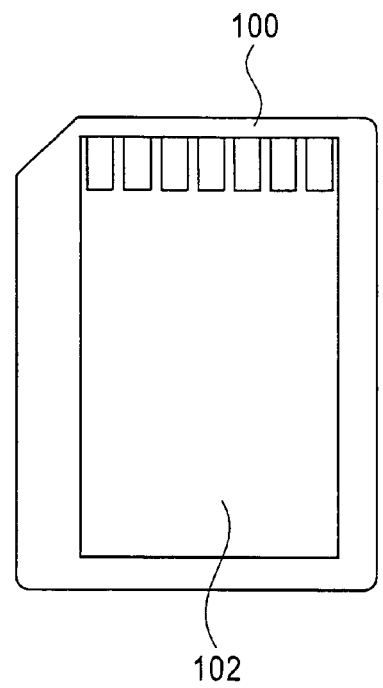
FIG. 3C is a plan view of the IC card.
Figure 5A:
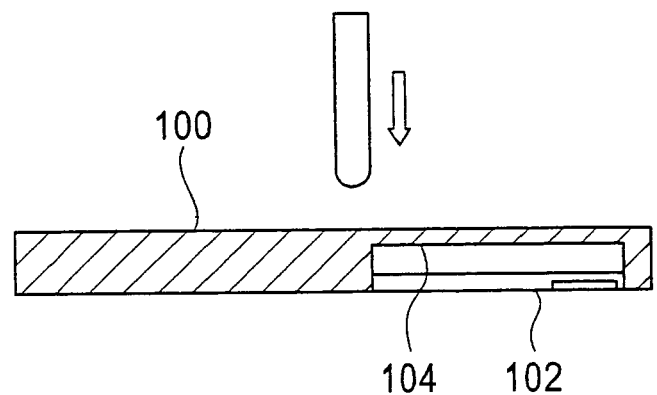
FIG. 5A is a cross-sectional view prior to the application of bending stress to the conventional IC card.
Figure 5B:
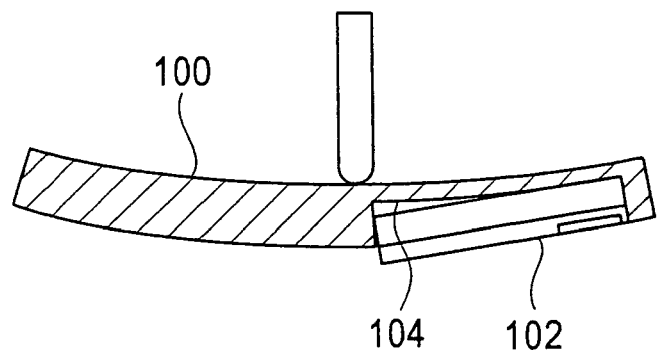
FIG. 5B is a cross-sectional view of the IC card form which the substrate has peeled off under the effect of the bending force.
Figure 5C:
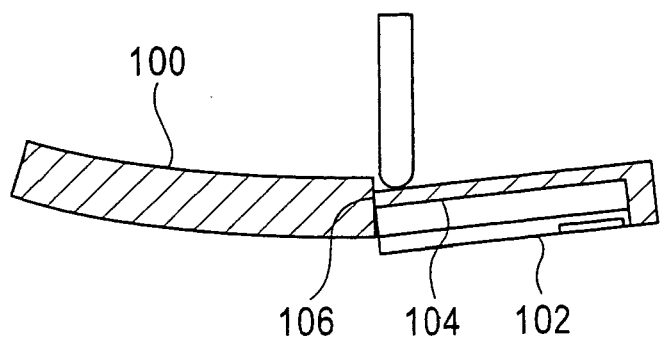
FIG. 5C is a cross-sectional view of the IC card in which cracking has occurred under the effect of the bending force.

Further, in the present embodiment, the second protrusions 30 have a constant width, but as shown in FIG. 2, the portion that is in contact with the side wall 20A may be set to have a large width and the width may decrease with the distance from the side wall 20A in order to enhance the reinforcing effect. The surface area of the second protrusions 30 may be set by taking into account the balance of the reinforcing effect and bonding surface area.

The bonding strength can thus be ensured, while increasing the reinforcement effect.

Furthermore, in the present embodiment, two first protrusions 28 and two second protrusions 30 were provided in the recess 20, but the number of the protrusions is not limited to that of the embodiment. The shape of the protrusions is also not limited to that of the embodiment.

Further, it is preferred that fine peaks and valleys be provided in the bottom portion of the recess 20 by conducting crimping or surface patterning in order to increase the bonding strength of the case 12 and LGA 18.

Further, in the present embodiment, an example of employing the present invention in a MMC card was described, but the present invention is not limited to such an application.

This application is based on a Japanese patent application No. 2004-348970 which is incorporated herein by reference.

What is claimed is:

1. An IC card in which a substrate with a semiconductor chip mounted thereon is fitted and fixed with an adhesive in a recess provided in a side surface of a case in the form of a card and in which the direction of insertion into a card slot is specified, wherein
   at least one or more protrusions that abut against the rear surface of said substrate and form a gap for holding said adhesive between said substrate and said bottom portion are formed in the bottom portion of said recess; and
   at least one of said protrusions is linked to the side wall of the recess extending in the direction crossing said insertion direction and in the closest proximity to the central portion of said recess in the insertion direction of said case.

2. The IC card according to claim 1, wherein said protrusion linked to said side wall of the recess is formed to become narrower with the distance from said side wall of the recess.

3. The IC card according to claim 2, wherein the height of said protrusion is set within a range of 0.2–0.3 mm.

4. The IC card according to claim 3, wherein said side wall of the recess is disposed within a range of ½ L to ⅓ L from the distal edge of said card in the insertion direction, where L stands for the length of the card in the insertion direction.

5. The IC card according to claim 2, wherein said side wall of the recess is disposed within a range of ½ L to ⅓ L from the distal edge of said card in the insertion direction, where L stands for the length of the card in the insertion direction.

6. The IC card according to claim 1, wherein the height of said protrusion is set within a range of 0.2–0.3 mm.

7. The IC card according to claim 6, wherein said side wall of the recess is disposed within a range of ½ L to ⅓ L from the distal edge of said card in the insertion direction, where L stands for the length of the card in the insertion direction.

8. The IC card according to claim 1, wherein said side wall of the recess is disposed within a range of ½ L to ⅓ L from the distal edge of said card in the insertion direction, where L stands for the length of the card in the insertion direction.

* * * * *